United States Patent
Bellinghausen et al.

(10) Patent No.: US 6,288,562 B1
(45) Date of Patent: Sep. 11, 2001

(54) TEST PIN FOR A PRINTED CIRCUIT BOARD

(75) Inventors: Carl P. Bellinghausen, Newton; M. Kenneth McGuinness, Denville, both of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/360,271

(22) Filed: Jul. 26, 1999

(51) Int. Cl.⁷ .................................................. G01R 31/02
(52) U.S. Cl. ........................................................ 324/761
(58) Field of Search ............................... 324/761, 754, 324/755, 760, 762, 765, 149, 72.5; 174/250; 361/600

(56) References Cited

U.S. PATENT DOCUMENTS

| Re. 36,442 | * | 12/1999 | Kardos | 324/758 |
| 4,806,856 | * | 2/1989 | Hvezda et al. | 324/761 |
| 5,833,479 | * | 11/1998 | Talbot | 324/72.5 |

* cited by examiner

Primary Examiner—Safet Metjahic
Assistant Examiner—James C Kerveros
(74) Attorney, Agent, or Firm—David L. Davis

(57) ABSTRACT

A test pin for providing test probe access to a plated via in a multi-layer printed circuit board. The test pin comprises a first straight part adapted to extend through the via in contact with the via plating and a second part formed into a loop for engagement by a test probe clip.

6 Claims, 1 Drawing Sheet

TEST PIN FOR A PRINTED CIRCUIT BOARD

BACKGROUND OF THE INVENTION

This invention relates to the testing of printed circuit boards and, more particularly, to a test pin for providing test probe access to a multi-layer printed circuit board.

With advances in the miniaturization of surface mount printed circuit components, it is becoming more difficult to connect test probes to printed circuit assemblies. Traditionally, test connections were made to an integrated circuit package by using a spring loaded clip device that fit over the integrated circuit package and made contact with its mounting legs which provide connections to the integrated circuit within the package. With the advent of ball grid array integrated circuit packages and other small parts that have their interconnection underneath their package bodies, this is no longer possible. Accordingly, a need exists for providing test probe access for such a circuit package.

Modern printed circuit boards are typically a laminate of multiple layers each having circuit traces thereon. Small plated through-holes, called vias, are used to interconnect the printed wiring traces from one layer of the board to another. These vis are also used for manufacturing test purposes and typically have a ten mil finished inside hole diameter, which is usually filled with solder during the manufacturing process. It would be desirable to be able to utilize the vias for obtaining test probe access.

SUMMARY OF THE INVENTION

According to the present invention, there is provided a conductive test pin for use with a multi-layer printed circuit board having a plated via interconnecting circuit traces on two layers of the board. The test pin comprises a first straight part adapted to extend through the via in contact with the via plating and a second part formed into a loop for engagement by a test probe clip. The loop is dimensioned larger than the via so that the loop remains outside the via.

A method according to the present invention provides test probe access to a plated via in a multi-layer printed circuit board. The method comprises the steps of providing a conductive test pin having a first straight part and a second part formed into a loop, applying heat to the via, adding solder to the via, inserting the test pin straight part into the via, and removing heat from the via.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 1:
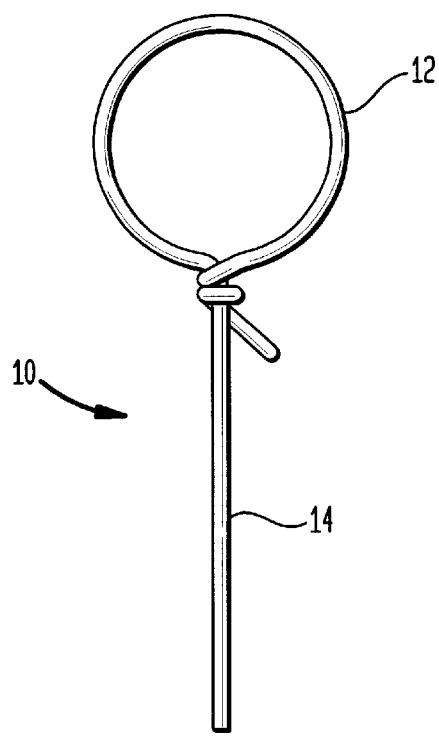
FIG. 1 is an elevational view showing an embodiment of a test pin constructed according to the principles of the present invention.
Figure 2:
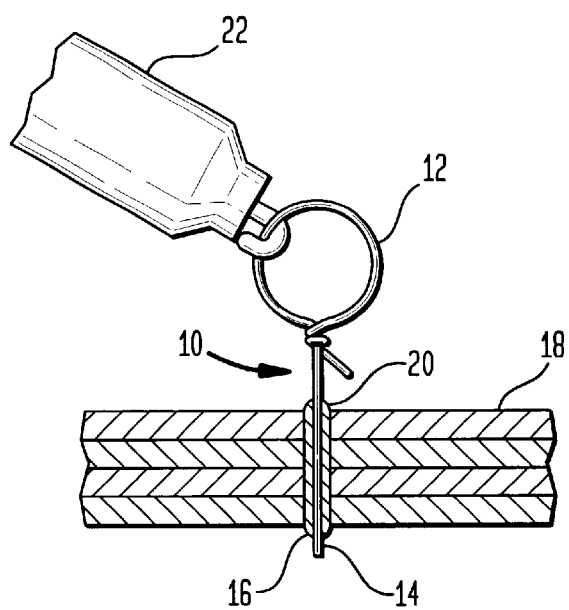
FIG. 2 shows the test pin of FIG. 1 installed in a via of a multi-layer printed circuit board, with a test probe clipped to the loop of the test pin.

Referring now to the drawings, FIG. 1 shows a test pin, designated generally by the reference numeral 10, constructed according to the present invention. The test pin 10 is formed from a length of conductive wire, preferably having a diameter of nine mils. The wire is plated with a material affording good solderability, such as gold. To form the test pin 10 from the length of wire, an end portion of the wire is bent, illustratively around a mandrel, into a substantially circular loop 12 illustratively having an inside diameter of approximately 0.062 inches. The loop 12 is terminated by at least one twist, and preferably one and a half twists, around the straight part, or stem, 14 of the test pin 10. Illustratively, the length of the stem 14 is approximately 0.186 inches. FIG. 2 shows a test pin 10 installed in a via 16 of a multi-layer printed circuit board 18. The via 16 is a plated through-hole which provides interconnection between circuit traces on different layers of the printed circuit board 18 and is usually filled with solder 20 during the manufacturing process. To install the test pin 10 in the via 16, a soldering iron and tweezers are used. The soldering iron is applied to the upper surface of the printed circuit board 18 and against the via 16 to heat the solder 20 filling the via 16. A small amount of additional solder is then applied while keeping the soldering iron in contact with the via 16. The loop 12 of the test pin 10 is then gripped by the tweezers and the distal end of the stem 14 is placed into the molten puddle of solder. The rigidity of the stem 14 allows it to be "teased" into the via 16 without bending. The soldering iron is then removed so that the solder can solidify and keep the test pin 10 in place. The rest pin 10 can be inserted from either surface of the printed circuit board 18. Once the test pin 10 has been installed, the loop 10 provides a convenient point for attachment of a clip-on test probe 22. When it is desired to remove the test pin 10, a soldering iron is used to soften the solder 20 and the test pin 10 is pulled from the via 16.

Accordingly, there has been disclosed a test pin and method for providing test probe access to a plated via in a multi-layer printed circuit board. While an illustrative embodiment of the present invention has been disclosed, it will be appreciated by those skilled in the art that various adaptations and modifications to the disclosed embodiment are possible, and it is therefore intended that this invention be limited only by the scope of the appended claims.

What is claimed is:

1. A conductive test pin for use with a multi-layer printed circuit board having a plated via interconnecting circuit traces on two layers of the board, the test pin comprising:
   a first straight part adapted to extend through the via in contact with the via plating; and
   a second part formed into a substantially circular loop for engagement by a test probe clip, the loop being dimensioned larger than the via so that the loop remains outside the via;
   wherein the length of the first straight part is greater than the diameter of the loop.

2. The test pin according to claim 1 wherein the test pin is plated with a material affording good solderability.

3. The test pin according to claim 2 wherein the material is gold.

4. The test pin according to claim 1 wherein the loop is terminated by at least one twist around the first straight part.

5. A method for providing test probe access to a plated via in a multi-layer printed circuit board, comprising the steps of:

providing a conductive test pin having a first straight part and a second part formed into a substantially circular loop, wherein the length of the first straight part is greater than the diameter of the loop;

applying heat to the via;

adding solder to the via;

inserting the test pin first straight part into the via; and removing heat from the via.

6. The method according to claim 5 wherein the step of providing a conductive test pin comprises the steps of:

providing a straight conductive wire;

bending an end portion of the wire into a substantially circular loop to form the second part of the test pin; and terminating the circular loop by at least one twist around the first straight part of the test pin.

\* \* \* \* \*